(12) United States Patent
Pabst

(10) Patent No.: US 11,280,822 B2
(45) Date of Patent: Mar. 22, 2022

(54) MEASUREMENT SYSTEM, MEASUREMENT SETUP AS WELL AS METHOD FOR PERFORMING MEASUREMENTS

(71) Applicant: Rohde & Schwarz GmbH & Co. KG, Munich (DE)

(72) Inventor: Alexander Pabst, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 13 days.

(21) Appl. No.: 16/743,240

(22) Filed: Jan. 15, 2020

(65) Prior Publication Data

US 2020/0264223 A1 Aug. 20, 2020

(30) Foreign Application Priority Data

Feb. 19, 2019 (EP) ..................................... 19158084

(51) Int. Cl.
*G01R 31/00* (2006.01)
*G01R 29/10* (2006.01)
*G01R 29/08* (2006.01)

(52) U.S. Cl.
CPC ....... *G01R 29/105* (2013.01); *G01R 29/0878* (2013.01)

(58) Field of Classification Search
CPC .............. G01R 29/105; G01R 29/0821; G01R 29/0878; G01R 29/0892; G01R 29/0814; G01R 29/0871; G01R 31/2822; G01R 29/3025; G01R 29/311; G01R 29/303
See application file for complete search history.

(56) References Cited

U.S. PATENT DOCUMENTS

| | | | |
|---|---|---|---|
| 7,035,594 B2 * | 4/2006 | Wallace | H01Q 3/26 343/703 |
| 9,991,591 B1 * | 6/2018 | Rowell | H01Q 1/125 |
| 2002/0160717 A1 * | 10/2002 | Persson | G01R 29/0821 455/67.11 |
| 2008/0129615 A1 * | 6/2008 | Breit | H04B 17/29 343/703 |
| 2014/0141727 A1 * | 5/2014 | Kildal | G01R 29/0821 455/67.12 |
| 2018/0321292 A1 * | 11/2018 | Bartko | G01R 29/0821 |
| 2019/0187199 A1 * | 6/2019 | Mellein | H04B 17/15 |

(Continued)

FOREIGN PATENT DOCUMENTS

| | | |
|---|---|---|
| CN | 104215855 A1 | 12/2014 |
| EP | 3276362 A1 | 1/2018 |

(Continued)

*Primary Examiner* — Thang X Le
(74) *Attorney, Agent, or Firm* — Christensen O'Connor Johnson Kindness PLLC

(57) ABSTRACT

A measurement system for performing measurements of the total radiated power of a device under test has an anechoic chamber, a positioner with a device section for supporting the device under test, at least one link antenna for establishing communication with the device under test and a plurality of different measurement antennas. The measurement antennas are arranged in the anechoic chamber and are designed to carry out a total radiated power measurement. Further, a measurement setup as well as a method for performing measurements of the total radiated power of a DUT are shown.

16 Claims, 1 Drawing Sheet

(56) References Cited

U.S. PATENT DOCUMENTS

2019/0229817 A1* 7/2019 Axmon ................ H04B 7/0691
2019/0393968 A1* 12/2019 Ioffe ...................... H04B 17/14
2020/0341044 A1* 10/2020 Kvarnstrand ...... G01R 29/0871

FOREIGN PATENT DOCUMENTS

WO      2018/031119 A1    2/2018
WO      2018/128950 A2    7/2018

* cited by examiner

MEASUREMENT SYSTEM, MEASUREMENT SETUP AS WELL AS METHOD FOR PERFORMING MEASUREMENTS

FIELD OF THE DISCLOSURE

The disclosure concerns a measurement system for performing measurements of the total radiated power of a device under test, a measurement setup for performing measurements of the total radiated power of a device under test as well as a method for performing measurements of the total radiated power of a device under test.

BACKGROUND

The total radiated power of radio devices in networks, especially the spurious emissions of these devices, are regulated by the standards that govern the wireless network. Thus, any device that is designed for use in such a wireless network has to fulfill these requirements. In order to measure the total radiated power of a device, measurement systems with an anechoic chamber and a measurement antenna are known.

However, as the total radiated power measurements have to be performed over a wide range of frequencies, the measurement antenna of such measurement systems do not cover the whole frequency range. Thus, several measurements have to be carried out.

SUMMARY

There is a need to provide a measurement system, a measurement setup as well as a method for performing total radiated power measurements of a device under test that allow quick measurements over a broad frequency range.

For this purpose or others, a measurement system for performing measurements of the total radiated power of a device under test is provided. In an embodiment, the measurement system comprises an anechoic chamber, a positioner with a device section for supporting the device under test, at least one link antenna for establishing communication with the device under test and a plurality of different measurement antennas, wherein the measurement antennas are arranged in the anechoic chamber and are designed to carry out a total radiated power measurement.

By using a plurality of measurement antennas designed for total radiated power measurements, multiple measurements can be carried out at the same time. Thus, the duration of a total radiated power measurement can be reduced.

The device section may lie within the quiet zone of the anechoic chamber, for example along the entire measurement path.

The link antenna is particularly adapted to establish communication, especially far-field communication with the device under test using radio frequency signals.

In some embodiments, the measurement antennas are designed to determine spurious emissions of the device under test.

In an embodiment, at least two of the measurement antennas are adapted to measure a different frequency range, for example each of the measurement antennas is adapted to measure a different frequency range. This way, the frequency range, in which the measurement is carried out, can be multiplied even though the frequency range of every single antenna may be smaller than the desired frequency range of the measurement system.

The frequency ranges of the measurement antennas may overlap.

In an aspect, the measurement antennas are arranged in the corners of anechoic chamber and/or equidistant to the device section. This way, no deviation between the measurements of the various measurement antennas is present.

In order to reduce the size of the measurement system, the measurement antennas may be arranged in near-field distance of the device section.

In an embodiment of the disclosure, the measurement system comprises a reflector for the signal of the link antenna, the reflector being arranged in the anechoic chamber, particularly wherein the shortest propagation path of signals of the at least one link antenna to the device section runs via the reflector. This way, the size of the measurement system can be reduced further.

The measurement system may be a compact antenna test range (CATR) system using indirect communication between the link antenna and the device under test via the reflector.

In an embodiment, the shortest propagation path is longer than the far field distance.

For a complete and versatile measurement, the positioner is configured to move the device section in three dimensions, for example along a sphere. The sphere is for example a full sphere.

To this end, the positioner, in some embodiments, comprises a pivoting arm, and, for example, a turntable arranged on the pivoting arm. The device section may be provided on the pivoting arm, especially on the turntable. In some embodiments, the pivoting arm may be u-shaped and/or the turntable being a 360° turnable turntable.

For the above purpose, further a measurement setup for performing measurements of the total radiated power of a device under test is provided. The measurement setup comprises a device under test and a measurement system according to the disclosure as discussed above, wherein the device under test is fixed in the device section of the positioner.

Further, for above purpose or others, a method is provided for performing measurements of the total radiated power of a device under test, for example using a measurement system according to the disclosure as described above. In an embodiment, the method comprises the following steps:

placing the device under test in an anechoic chamber on a positioner;

moving the device under test in the anechoic chamber along a measurement path by the positioner; and measuring spurious emissions of the device under test using a plurality of measurement antennas arranged in the anechoic chamber while the device under test is moved along the measurement path.

In the sense of the disclosure, measuring while the device under test is moved may be done by moving and measuring continuously and simultaneously or by alternating a moving step and a measuring step.

The features and advantages discussed in the context of the measuring system also apply to the method and vice versa.

In an aspect of the disclosure, a communication is established with the device under test using a link antenna arranged in the anechoic chamber. Thus, the total radiated power may be measured under working conditions. The communication may be present during measurement. The link antenna may also be called "feed antenna".

In order to perform complete measurements, the measurement path is a spiral path and/or covers a full sphere.

In an embodiment, the distance between the device under test and the measurement antennas remains the same along the measurement path. In some embodiments, the distance remains the same along the full measurement path. This way, the measurements of the measurement antennas do not have to be normalized with respect the distance to the device under test.

In order to allow very quick or very precise measurements, the device under test may be moved continuously or in a stepped manner.

In an aspect of the disclosure, the orientation, for example the azimuth and/or the elevation of the device under test with respect to at least one measurement antenna, for example each of the measurement antennas, is recoded during the measurement. This allows comparing the measurements of different measurement antennas with one another.

For an efficient evaluation, the measurements of the measurement antennas may be received by an evaluation unit or circuit and the measurements are transferred to the same calculation base by the evaluation unit, for example on the basis of the recorded orientation, for example the recorded azimuth and/or elevation.

In other words, each antenna may measure the spurious emissions of the device under test at a different angle due to the position of the device under test. However, as the device under test faces each one of the measurement antennas in a similar manner during a full measurement, the measurement results may be transferred to the same coordinate system.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

FIG. 1b shows an example measurement path of the device section of the measurement system according to FIG. 1a.

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1A:
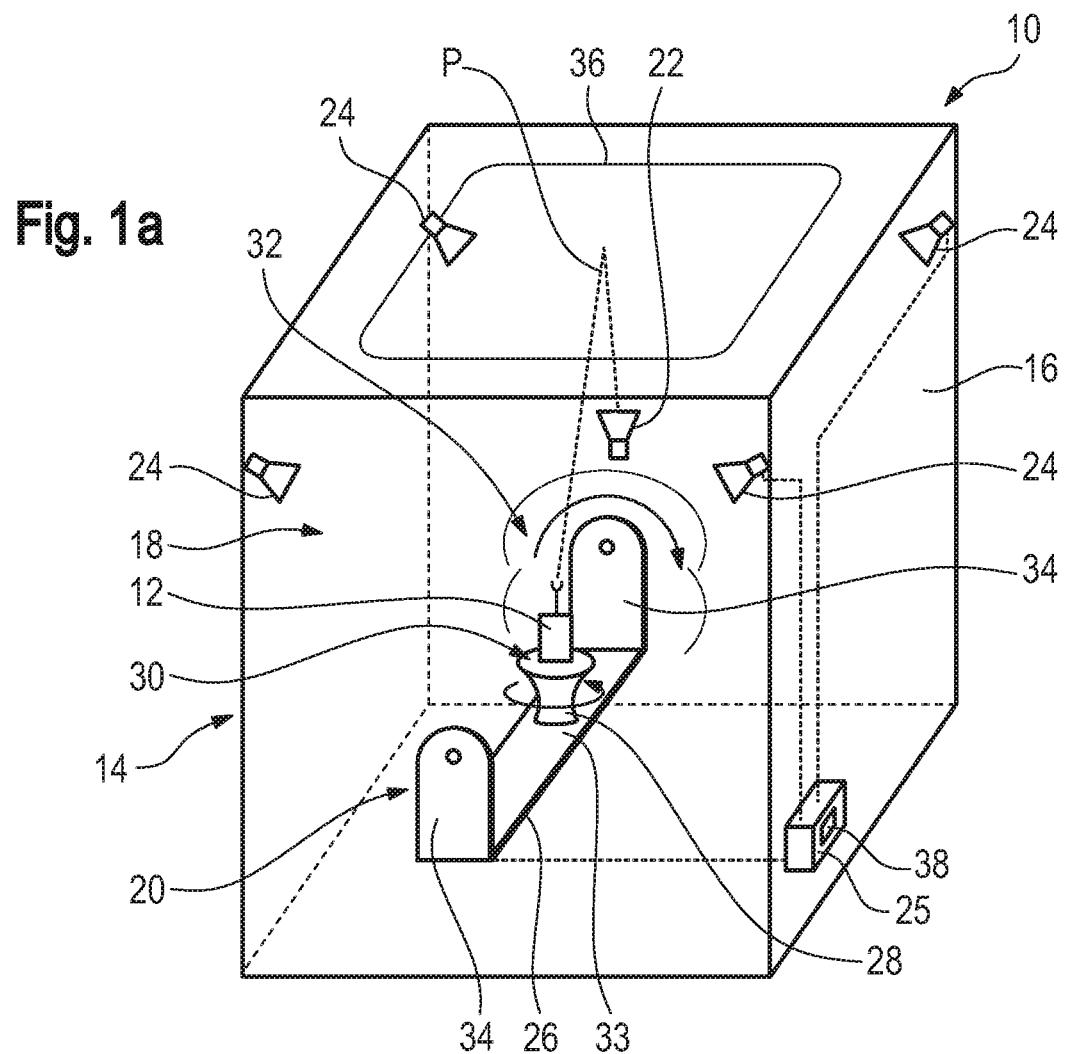
FIG. 1a shows a measurement setup according to the disclosure with a measurement system according to an embodiment of the disclosure.
Figure 1B:

FIGS. 1a and 1b show a measurement setup 10 having a device under test 12 (DUT) and a measurement system 14. The measurement setup 10 is used for performing measurements of the total radiated power (TRP) of the DUT 12.

The DUT 12 may be a mobile device, like a smartphone, a tablet or a laptop computer, an Internet of Things (IoT) component or any other device with a radio frequency transmitter. In some embodiments, the DUT 12 is a device for 5G NR FR2 networks.

The measurement system 14 is a measurement system for performing measurements on a DUT in order to determine specific characteristics of the DUT 12, more precisely the radio frequency transmitter of the DUT 12.

The measurement system 14 comprises a housing 16 with a door (not shown), in which an anechoic chamber 18 is provided. The measurement system 14 further comprises a positioner 20, at least one link antenna 22—one link antenna 22 in the shown embodiment—and a plurality of measurement antennas 24, in the shown embodiment four measurement antennas 24. The positioner 20, the link antenna 22 and the measurement antennas 24 are located within the anechoic chamber 18 and they are connected to a control circuitry or unit 25 of the measurement system 14.

In the shown embodiment, the control unit 25 is depicted within the housing 16. However, the control unit 25 and/or the evaluation circuitry or unit 38 may also be a component outside and separate from the housing 16.

In an embodiment, the positioner 20 comprises a pivoting arm 26 and a turntable 28 mounted on the pivoting arm 26. The turntable 28 may be a 360° turnable turntable. The turntable 28 has a device section 30, on which the DUT 12 is securely fixed. In operation, the positioner can be controlled via suitable control signals in order to alter the positioning of the device section 30, and the DUT 12 when attached thereto.

The device section 30 is arranged in a quiet zone 32 of the anechoic chamber 18, even if the device section 30 is moved by the positioner 20.

The pivoting arm 26 is shown in this embodiment as a u-shaped pivoting arm with a center piece 33 and two side pieces 34. Of course, the pivoting arm 26 may have other shapes. The turntable 28 is arranged in the center of the pivoting arm 26, i.e. in the center of the u-shape. The side pieces 34 of the pivoting arm 26 are rotatably mounted on opposite walls of the housing 16 such that the pivoting arm 26 may be rotated around an axis extending through the device section 30.

Due to a combination of the movement of the pivoting arm 26 and the rotational movement of the turntable 28, the positioner 20 is able to move the device section 30 and the DUT 12 along a measurement path M, for example a measurement path lying on a full sphere. An example of such a measurement path is illustrated in FIG. 1b.

The link antenna 22 is adapted and controlled by the control unit 25 to establish communication with the DUT 12. The link antenna 22 may communicate with the DUT 12 using frequencies between 20 and 40 GHz.

The signals emitted and received by the link antenna 22 and received and emitted by the DUT 12 for communication between the link antenna 22 and the DUT 12 do not propagate in a direct way between the link antenna 22 and the DUT 12 but indirectly.

For this purpose, the link antenna 22 may be a highly directional antenna or a signal absorbing wall is provided between the link antenna 22 and the DUT 12.

The indirect propagation path P of the signals runs via a wall of the anechoic chamber 18 that has been provided with a reflector 36. In the shown embodiment, the ceiling of the anechoic chamber 18 is provided with a reflector 36.

Thus, the shortest propagation path of signals emitted by the link antenna 22 to the DUT 12 runs via the reflector 36 and has a length larger than the far field length, so that the communication between the link antenna 22 and the DUT 12 is a far-field communication.

Because of the indirect propagation path, the measurement system 14 is a compact antenna test range (CATR).

The measurement antennas 24 are arranged equidistant to the device section 30 and for example within the near-field distance of the device section 30.

In the shown embodiment, the measurement antennas 24 are arranged in the corners of the anechoic chamber 18. Each measurement antenna 24 is adapted to measure signals from the DUT 12 in a different frequency range. For example, the first measurement antenna 24 measures signals in the range between 40 and 60 GHz, the second measurement antenna 24 in the range of 50 to 75 GHz, the third measurement antenna 24 in the range of 60 to 90 GHz and the fourth measurement antenna 24 in the range of 75 to 110 GHz.

The measurement antennas 24 are designed to measure spurious emissions from the DUT 12.

Figure 2:
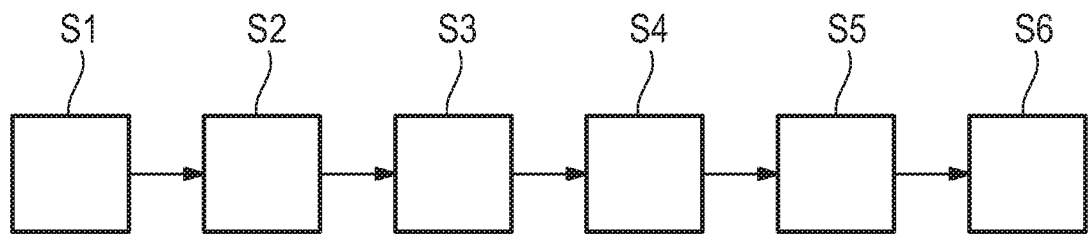
FIG. 2 shows a flow-chart of a method according to an embodiment of the disclosure.

For performing measurements of the total radiated power of the DUT 12, the control unit 25 controls the measurement system 14, for example the positioner 20, the link antenna 22 and the measurement antennas 24 to perform the following steps. The steps of the method are shown in FIG. 2.

In a first step S1, the DUT 12 is placed in the anechoic chamber 18 in the device section 30 of the positioner 20. The DUT 12 is fixed at the device section 30 so that the DUT 12 cannot move with respect to the positioner 20.

In a second step S2, the control unit 25 controls the link antenna 22 to establish a communication with the DUT 12.

In step S3, the positioner 20 is controlled by the control unit 25 to move the DUT 12 along a measurement path M. In an embodiment, the measurement path M may be a spiral path that covers a full sphere as shown in FIG. 1*b*. For example, the measurement path M is such that the distance between the DUT 12 and the measurement antennas 24 remains the same along the entire movement of the DUT 12, thus along the full measurement path M.

The DUT 12 may be moved along the measurement path M continuously or in a stepwise manner.

In step S4, carried out during the movement of the DUT 12 or after each movement step, each of the measurement antennas 24 measures the power radiated from the DUT 12 in the respective frequency range, especially the power emitted by spurious emissions of the DUT 12.

During the measurement, the communication between the link antenna 22 and the DUT 12 may be upheld.

During the measurement, in a simultaneous step S5, the orientation of the DUT 12 to each of the measurement antennas 24 is recorded, for example by the control unit 25 on the basis of the position of the positioner. The orientation may comprise the azimuth and/or the elevation of the DUT with respect to the respective measurement antenna 24.

In the next step S6, the measurements of the measurement antennas 24 and the recorded orientations are fed to an evaluation unit 38. The evaluation unit 38 may be a module or circuit of the control unit 25, for example.

The evaluation unit 38 uses the information about the orientation of the DUT 12 with respect to each of the measurement antennas 24 and the respective measurements of the radiated power of the DUT 12 at the orientation and transfers the measurements of the radiated power of the different measurement antennas 24 to the same calculation base. Thus, the data of the measurements transferred to the same calculation base is the same as if several measurements of the DUT 12 with only one measurement antenna had been carried out.

In other words, each measurement antenna 24 measures the radiated power, especially the spurious emissions at a different orientation due to the position of the DUT 12. However, as the DUT 12 faces each one of the measurement antennas 24 in a similar manner during the course of a full measurement, the measurement results may be transferred to the same coordinate system.

From the measurements of radiated power, the total radiated power in each frequency range is determined by the evaluation unit 38.

Thus, by using several measurement antennas 24, a very quick and reliable way of performing a measurement of the total radiated power of a DUT 12, especially of spurious emissions is provided.

Certain embodiments disclosed herein utilize circuitry (e.g., one or more circuits) in order to implement protocols, methodologies or technologies disclosed herein, operably couple two or more components, generate information, process information, encode signals, decode signals, transmit and/or receive signals, control other devices, etc. Circuitry of any type can be used.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from The embodiments of the invention in which an exclusive property or privilege is claimed are defined as follows:

1. A measurement system for performing measurements of the total radiated power of a device under test, comprising:
   an anechoic chamber;
   a positioner with a device section for supporting the device under test, wherein the positioner is configured to move the device section in three dimensions;
   at least one link antenna for establishing communication with the device under test and a plurality of different measurement antennas, wherein the measurement antennas are arranged in the anechoic chamber and are designed to carry out a total radiated power measurement;
   a reflector for the signal of the link antenna, the reflector being arranged in the anechoic chamber, wherein the shortest propagation path of signals of the at least one link antenna to the device section runs via the reflector, and wherein the shortest propagation path is longer than the far field distance such that the at least one link antenna is adapted to establish a far-field communication with the device under test using radio frequency signals.

2. The measurement system according to claim 1, wherein at least two of the measurement antennas are adapted to measure a different frequency range.

3. The measurement system according to claim 2, wherein each of the measurement antennas is adapted to measure a different frequency range.

4. The measurement system according to claim 1, wherein the measurement antennas are arranged at least of in the corners of the anechoic chamber and equidistant to the device section.

5. The measurement system according to claim 1, wherein the measurement antennas are arranged in near-field distance of the device section.

6. The measurement system according to claim 1, wherein the positioner is configured to move along a sphere.

7. The measurement system according to claim 1, wherein the positioner comprises a U-shaped pivoting arm, wherein a turntable is arranged on the U-shaped pivoting arm, and wherein side pieces of the U-shaped pivoting arm are rotatably mounted on opposite walls of a housing of the anechoic chamber.

8. A measurement setup for performing measurements of the total radiated power of the device under test, comprising:
   a device under test; and
   a measurement system, the measurement system comprising:
   an anechoic chamber;
   a positioner with a device section for supporting the device under test, wherein the positioner comprises a U-shaped pivoting arm, wherein a turntable is arranged on the U-shaped pivoting arm, and wherein side pieces of the U-shaped pivoting arm are rotatably mounted on opposite walls of a housing of the anechoic chamber; and
   at least one link antenna for establishing communication with the device under test and a plurality of different measurement antennas, wherein the measurement antennas are arranged in the anechoic chamber and are designed to carry out a total radiated power measurement,
   wherein the device under test is fixed in the device section of the positioner.

9. A method for performing measurements of the total radiated power of a device under test, comprising:
   placing the device under test in an anechoic chamber on a positioner having a pivoting arm and a turntable arranged on the pivoting arm;
   moving the device under test in the anechoic chamber along a measurement path by the positioner; and
   measuring spurious emissions of the device under test using a plurality of measurement antennas arranged in the anechoic chamber while the device under test is moved along the measurement path,
   wherein the positioner moves the device section and the device under test along a measurement path lying on a full sphere due to a combination of the movement of the pivoting arm and the rotational movement of the turntable.

10. The method according to claim 9, wherein communication is established with the device under test using a link antenna arranged in the anechoic chamber.

11. The method according to claim 9, wherein at least one of the measurement path is a spiral path and the measurement path covers a full sphere.

12. The method according to claim 9, wherein the distance between the device under test and the measurement antennas remains the same along the measurement path.

13. The method according to claim 9, wherein the device under test is moved continuously or in a stepped manner.

14. The method according to claim 9, wherein the orientation of the device under test with respect to at least one of the measurement antennas is recoded during the measurement.

15. The method according to claim 9, wherein the measurements of the measurement antennas are received by an evaluation unit and the measurements are transferred to the same calculation base by the evaluation unit.

16. The method according to claim 15, wherein the measurements are transferred to the same calculation base by the evaluation unit on the basis of the recoded orientation.

* * * * *